(12) United States Patent
Yang

(10) Patent No.: US 11,830,702 B2
(45) Date of Patent: Nov. 28, 2023

(54) GRID STRUCTURE

(71) Applicant: CHANGXIN MEMORY TECHNOLOGIES, INC., Hefei (CN)

(72) Inventor: Wei Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 145 days.

(21) Appl. No.: 17/441,225

(22) PCT Filed: Jun. 30, 2021

(86) PCT No.: PCT/CN2021/103875
§ 371 (c)(1),
(2) Date: Sep. 20, 2021

(87) PCT Pub. No.: WO2022/083170
PCT Pub. Date: Apr. 28, 2022

(65) Prior Publication Data
US 2023/0059669 A1 Feb. 23, 2023

(30) Foreign Application Priority Data

Oct. 21, 2020 (CN) .......................... 202011131978.3

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/262* (2013.01)

(58) Field of Classification Search
CPC ...... H01J 37/20; H01J 37/26; H01J 2237/262; H01J 2237/201; G01N 23/04
See application file for complete search history.

(56) References Cited

U.S. PATENT DOCUMENTS

| | | | | |
|---|---|---|---|---|
| 8,729,469 B1* | 5/2014 | Schmidt | .............. | H01J 37/3023 |
| | | | | 250/311 |
| 9,281,163 B2* | 3/2016 | Routh, Jr. | ............. | H01J 37/261 |
| 9,837,246 B1* | 12/2017 | Geurts | .................. | H01J 37/317 |
| 11,476,079 B1* | 10/2022 | Kuba | ...................... | H01J 37/20 |
| 2006/0189021 A1* | 8/2006 | Iwasaki | .................. | H01J 37/20 |
| | | | | 438/398 |

(Continued)

FOREIGN PATENT DOCUMENTS

| | | |
|---|---|---|
| CN | 103646839 A | 3/2014 |
| CN | 104979151 A | 10/2015 |

(Continued)

OTHER PUBLICATIONS

International Search Report cited in PCT/CN2021/103875 dated Sep. 15, 2021, 8 pages.

*Primary Examiner* — David A Vanore
(74) *Attorney, Agent, or Firm* — Cooper Legal Group, LLC

(57) ABSTRACT

Embodiments of the present disclosure provide a grid structure. The grid structure includes a carrier and a support column; wherein the support column is located on the carrier, the support column has a top surface for supporting a sample; and the support column has a groove, the groove extends along a direction from the top surface to the carrier, and a groove wall of the groove is connected to the top surface.

15 Claims, 6 Drawing Sheets

(56) References Cited

U.S. PATENT DOCUMENTS

| | | | | |
|---|---|---|---|---|
| 2008/0185286 A1* | 8/2008 | Lehmann | ............ | H01J 37/3056 |
| | | | | 216/2 |
| 2012/0261588 A1* | 10/2012 | Wei | ............ | H01J 37/20 |
| | | | | 250/440.11 |
| 2013/0214468 A1* | 8/2013 | Giannuzzi | ............ | G01N 1/00 |
| | | | | 156/60 |
| 2014/0197311 A1* | 7/2014 | Nederlof | ............ | H01J 37/20 |
| | | | | 250/307 |
| 2015/0294834 A1* | 10/2015 | Routh, Jr. | ............ | H01J 37/261 |
| | | | | 250/442.11 |
| 2015/0364293 A1* | 12/2015 | Wei | ............ | H01J 37/20 |
| | | | | 216/17 |
| 2015/0364294 A1* | 12/2015 | Wei | ............ | H01J 37/26 |
| | | | | 250/440.11 |
| 2018/0286628 A1* | 10/2018 | Hasuda | ............ | H01J 37/3056 |
| 2023/0059669 A1* | 2/2023 | Yang | ............ | G01N 23/04 |

FOREIGN PATENT DOCUMENTS

| | | |
|---|---|---|
| CN | 205911282 U | 1/2017 |
| CN | 104979151 B | 11/2018 |
| CN | 111474197 A | 7/2020 |
| JP | 2009259556 A | 11/2009 |

\* cited by examiner

GRID STRUCTURE

CROSS-REFERENCE TO RELATED APPLICATIONS

The present disclosure is a national stage of International Patent Application No. PCT/CN2021/103875, filed on Jun. 30, 2021, which claims the priority to Chinese Patent Application 202011131978.3, titled "GRID STRUCTURE", filed to China National Intellectual Property Administration (CNIPA) on Oct. 21, 2020. The entire contents of International Patent Application No. PCT/CN2021/103875 and Chinese Patent Application 202011131978.3 are incorporated herein by reference.

TECHNICAL FIELD

The present disclosure relates to, but is not limited to, a grid structure.

BACKGROUND

Lens-coupled electron microscopes are increasingly used in the field of physical experiments to observe structures of materials. Before observation, samples need to be extracted from a to-be-observed material and processed.

At present, a focused ion beam (FIB) technique is usually used for sample processing. In the FIB technique, an ion beam generated by an ion source (for example a Ga, He, or Ne ion source) is accelerated and focused by an ion gun to act on a sample. A strong current ion beam can be used to strip surface atoms from the sample, to achieve micro-level and nano-level surface morphology processing. In addition, FIB can be further paired with a chemical gas reaction in a physical sputtering manner, to selectively strip a metal, silicon oxide, or deposited metal layer from the sample.

During sample processing, a grid structure is required to carry the sample. Two types of grid structures commonly used are copper mesh carbon film support grid structures and metal (copper/molybdenum, or the like) column grid structures.

However, use of the existing grid structures to carry the sample leads to a poor subsequent imaging effect of a transmission electron microscope (TEM).

SUMMARY

The following is a summary of subject matters described in detail in the present disclosure. This summary is not intended to limit the scope of protection of the claims.

The embodiments of the present disclosure provide a grid structure, including: a carrier; and a support column, the support column being located on the carrier, where the support column has a top surface for supporting a sample; and the support column has a groove, the groove extends along a direction from the top surface to the carrier, and a groove wall of the groove is connected to the top surface.

BRIEF DESCRIPTION OF THE DRAWINGS

The drawings incorporated into the specification and constituting a part of the specification illustrate the embodiments of the present application, and are used together with the descriptions to explain the principles of the embodiments of the present disclosure. In these drawings, similar reference numerals are used to represent similar elements. The drawings in the following descriptions are some rather than all of the embodiments of the present disclosure. Persons of ordinary skill in the art may obtain other drawings based on these drawings without creative efforts.

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

DETAILED DESCRIPTION

As can be learned from the background, use of a general grid structure to carry a sample leads to a poor subsequent imaging effect of a transmission electron microscope.

It is found through analysis that there are the following main reasons: When a FIB is used to prepare a sample, an ion beam bombards a grid structure, and secondary ions are generated on a surface of the grid structure. When a general grid structure carries a sample, a contact area between the sample and the grid structure is relatively large, and secondary ions are sputtered from a surface of the grid structure to a surface of the sample, resulting in contamination of the sample. Quality and purity of the sample have a decisive impact on a subsequent imaging effect and analysis accuracy of a transmission electron microscope.

Figure 1:
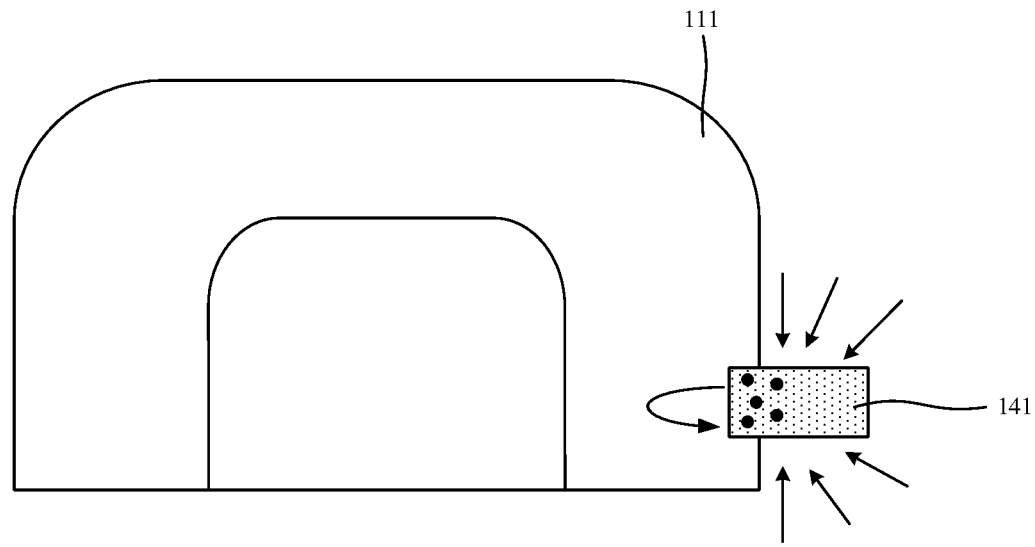
FIG. 1 is a partial front view of a grid structure carrying a sample.

FIG. 1 is a partial front view of a grid structure carrying a sample 141. Black dots in the figure are secondary ions. Straight line arrows around the sample 141 are ion beams. A curved line arrow on the left of the sample 141 is a sputtering direction of the secondary ions. The sample 141 is attached to a side wall of a support column 111 of the grid structure through focused ion beam induced deposition. During preparation of the sample 141, the secondary ions are sputtered from the side wall of the support column 111 to a surface of the sample 141, leading to contamination of the sample. In addition, the sample attached to the side wall of the support column 111 is easily inclined or detached due to the impact of gravity of the sample, affecting a subsequent imaging effect of a transmission electron microscope.

Figure 2:
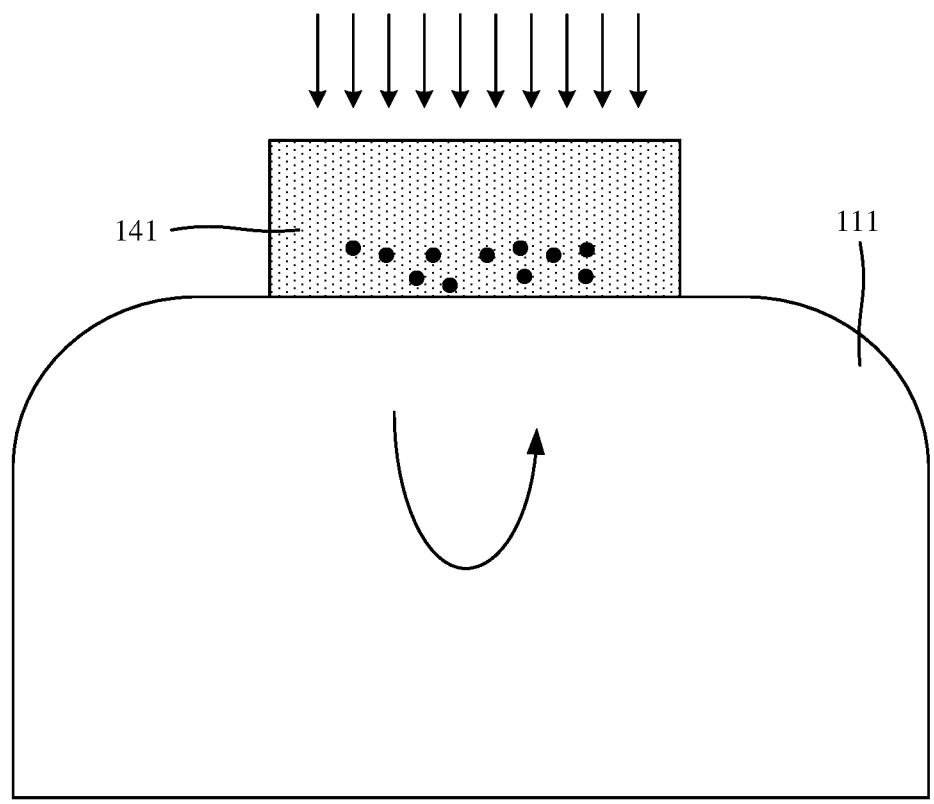
FIG. 2 is a partial front view of another grid structure carrying a sample.

FIG. 2 is a partial front view of another grid structure carrying a sample 141. Black dots in the figure are secondary ions. Straight line arrows above the sample 141 are ion beams. A curved line arrow below the sample 141 is a sputtering direction of the secondary ions. The sample 141 is placed on the top of a support column 111. A contract area between the sample 141 and the top of the support column 111 is large, contamination caused by sputtering of the secondary ions is serious, and a subsequent imaging effect of a transmission electron microscope is poor.

An embodiment of the present disclosure provides a grid structure. A support column of the grid structure has a top surface for supporting a sample. The support column has a groove. In this way, when the sample is placed on the top surface of the support column, the support column can support the sample more stably, and the groove can be used for diversion, thereby reducing contamination of the sample by secondary ions, and improving a subsequent imaging effect of a transmission electron microscope.

The embodiments of the present disclosure are described in detail below with reference to the accompanying drawings. Persons skilled in the art may understand that many technical details are proposed in the embodiments of the present disclosure to help readers better understand the present application. However, the technical solutions claimed in the present application can be achieved even without these technical details and various changes and modifications made based on the following embodiments.

Figure 3:
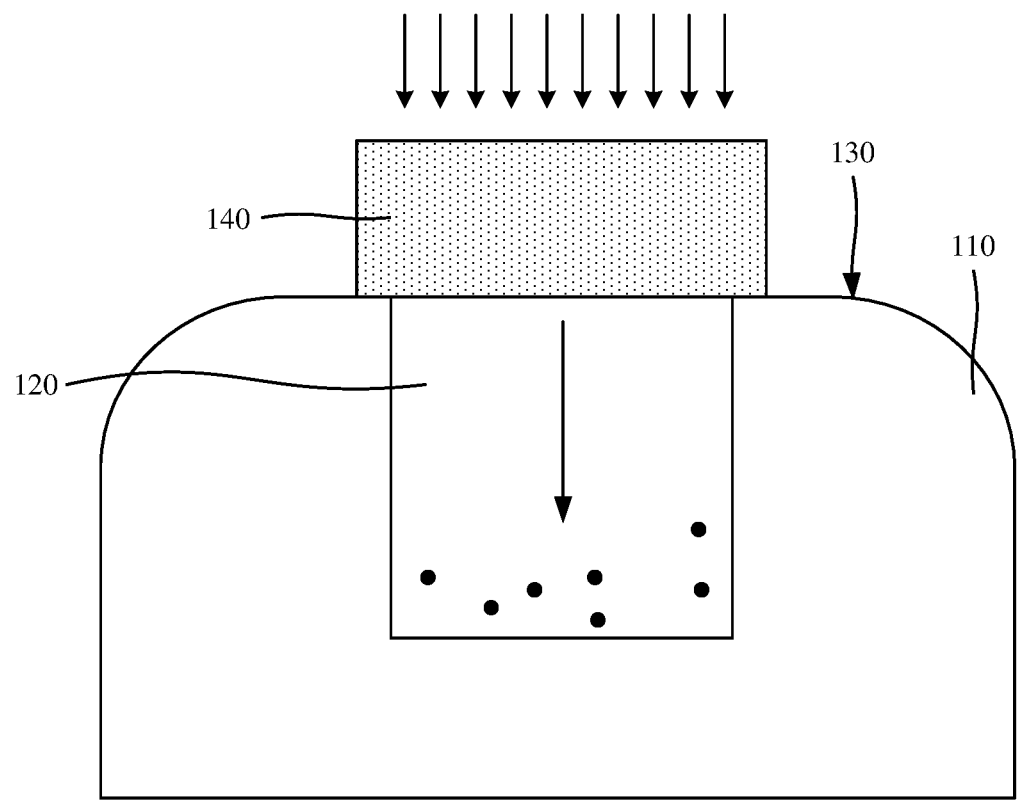
FIG. 3 is a partial front view of a grid structure carrying a sample according to an embodiment of the present disclosure.
Figure 4:
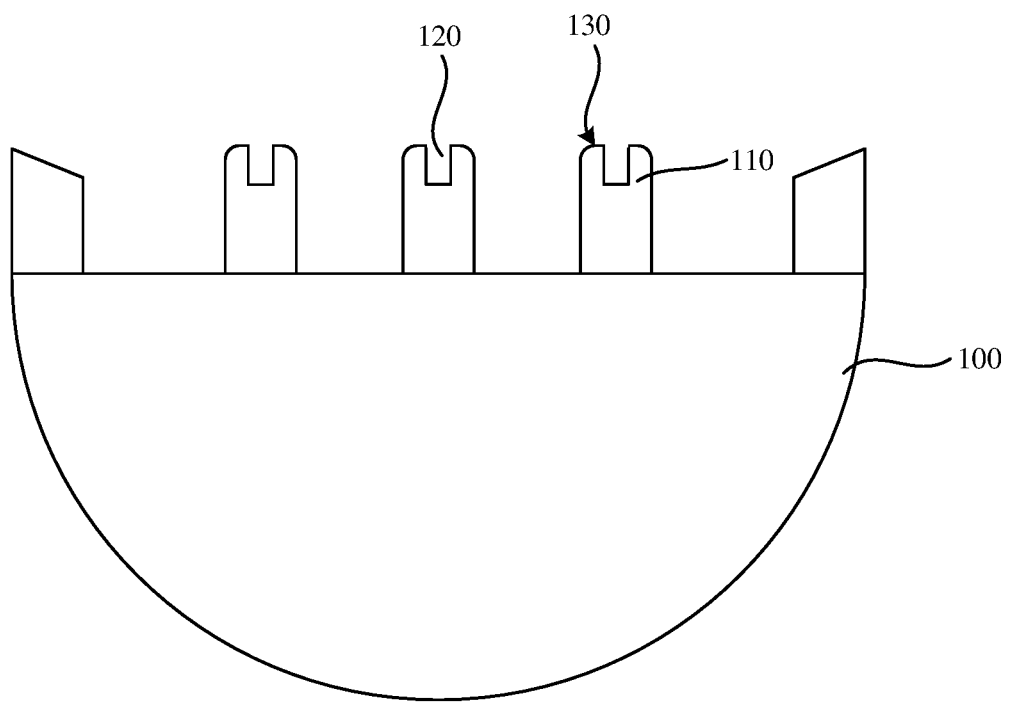
FIG. 4 is a front view of a first grid structure according to an embodiment of the present disclosure.

FIG. 3 is a partial front view of a grid structure carrying a sample according to an embodiment of the present disclosure. FIG. 4 is a front view of a first grid structure according to an embodiment of the present disclosure. Referring to FIG. 3 and FIG. 4, the grid structure includes a carrier 100 and a support column 110. The support column 110 is located on the carrier 100. The support column 110 has a top surface 130 for supporting a sample 140. The support column 110 has a groove 120. The groove 120 extends along a direction from the top surface 130 to the carrier 100, and a groove wall of the groove 120 is connected to the top surface 130.

Compared with a case in which the sample 140 is attached to a side wall of the support column 110, the case in which the top surface 130 of the support column 110 supports the sample 140 has better stability. In addition, the groove 120 can both reduce a contact area between the support column 110 and the sample 140 and divert secondary ions (black dots in FIG. 3), thereby improving quality of the sample 140 and improving an imaging effect of a transmission electron microscope.

Details are described below with reference to the accompanying drawings.

A volume of the carrier 100 is larger than a volume of the support column 110 to facilitate clamping. In this embodiment, the carrier 100 has three support columns 110. In other embodiments, a quantity of support columns can be increased or decreased accordingly.

The support column 110 is configured to support the sample 140. The support column 110 may be in a cylindrical shape, a cubic shape, or a combination of a cylindrical shape and a cubic shape.

The groove 120 is located on the top of the support column 110, and used to reduce a contact area with the sample 140 and divert the secondary ions.

Referring to FIG. 3 to FIG. 11, the top surface 130 is located at least on two sides of the groove 120. The top surface 130 should not be located only on one side of the groove 120. Otherwise, the groove 120 cannot be formed. A portion of the top surface 130 connected to the groove 120 carries the sample 140. Therefore, only an edge of the sample 140 is in contact with the top surface 130, and the sample 140 is less contaminated by the secondary ions.

Figure 5:
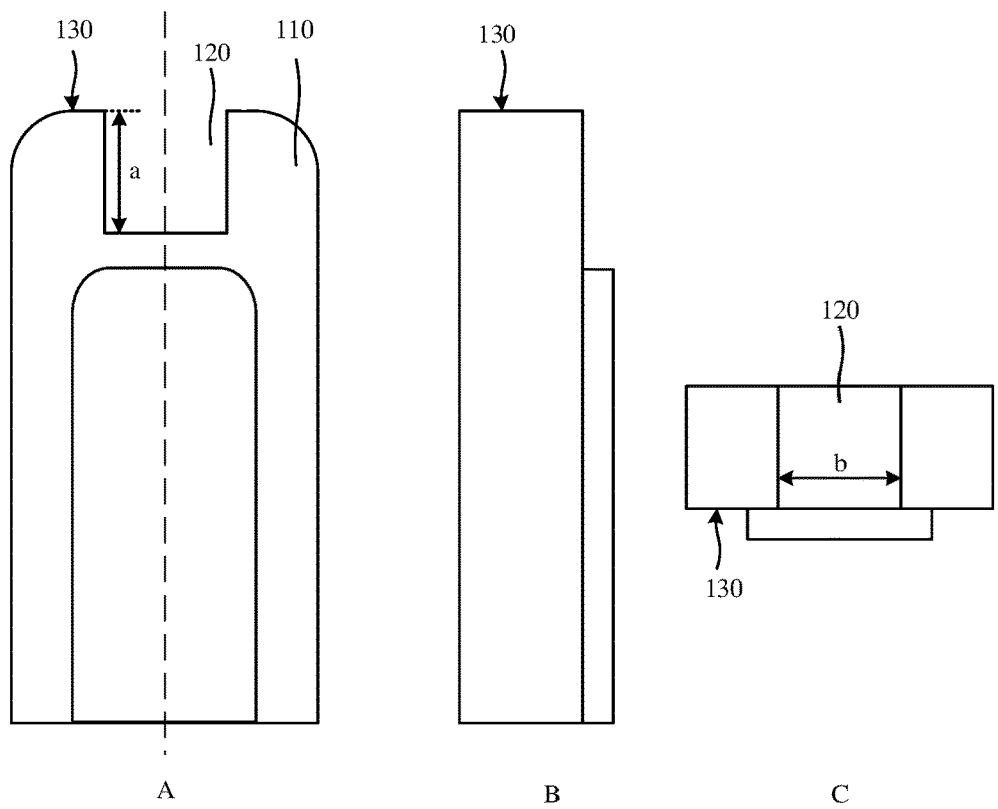
FIG. 5 is a schematic diagram of a first support column of a grid structure according to an embodiment of the present disclosure.
Figure 7:
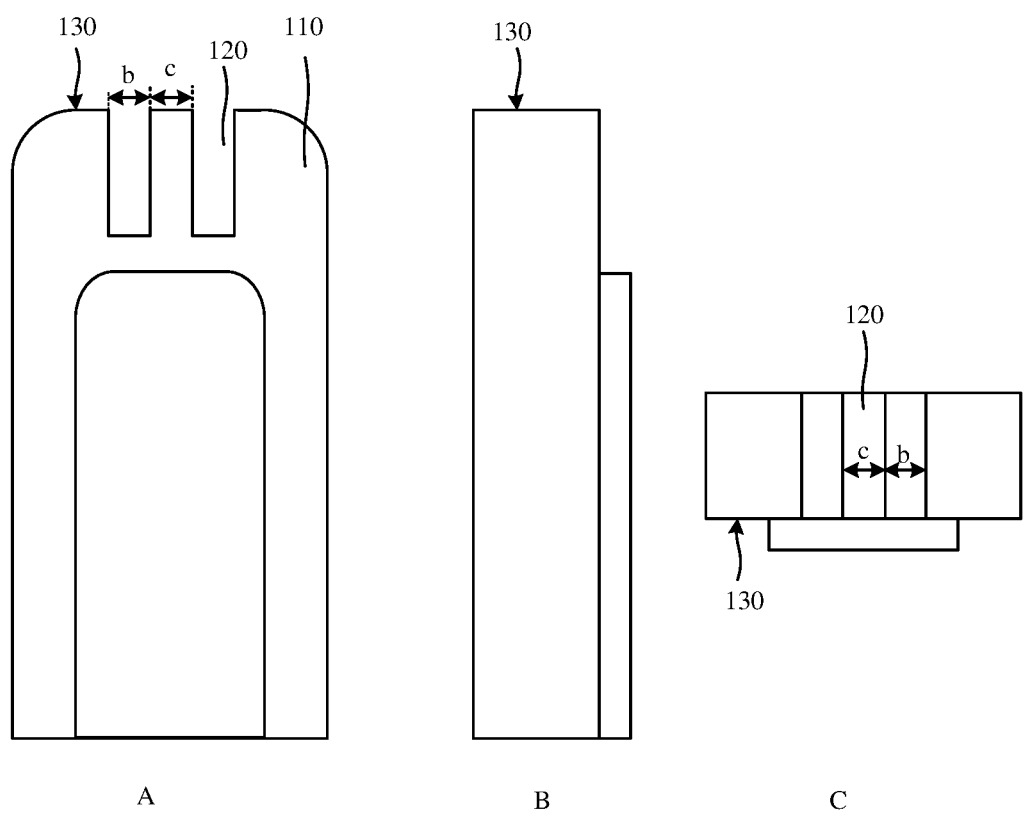
FIG. 7 is a schematic diagram of a third support column of a grid structure according to an embodiment of the present disclosure.

In an example, referring to FIG. 3 to FIG. 5 and FIG. 7 to FIG. 11, FIG. 5 is a schematic diagram of a first support column of the grid structure, A in FIG. 5 is a front view, B in FIG. 5 is a side view, and C in FIG. 5 is a top view. FIG. 7 is a schematic diagram of a third support column of the grid structure, A in FIG. 7 is a front view, B in FIG. 7 is a side view, and C in FIG. 7 is a top view. That the top surface 130 is located on the two sides of the groove 120 means that the groove 120 runs through the top of the support column 110. In this case, fewer parameters are considered and the manufacturing process is simpler during formation of the groove 120.

Figure 6:
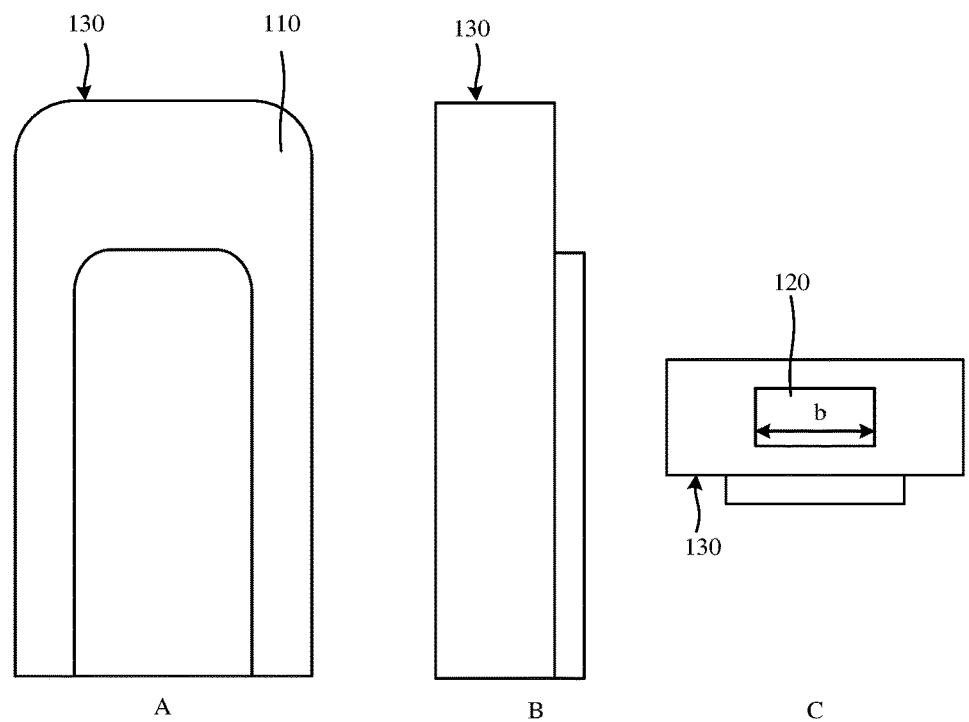
FIG. 6 is a schematic diagram of a second support column of a grid structure according to an embodiment of the present disclosure.

In another example, referring to FIG. 6, FIG. 6 is a schematic diagram of a second support column of the grid structure, A in FIG. 6 is a front view, B in FIG. 6 is a side view, and C in FIG. 6 is a top view. The top surface 130 surrounds the groove 120.

In this embodiment, the sample 140 may be placed directly on the top surface 130. In other embodiments, alternatively, the sample may be attached to the top surface through focused ion beam induced deposition, to improve adhesion between the sample and the top surface.

Still referring to FIG. 3 to FIG. 11, each support column 110 has a groove 120.

In an example, referring to FIG. 3 to FIG. 6 and FIG. 9 to FIG. 11, each support column 110 has one groove 120, and a central axis of the groove 120 coincides with a central axis of the support column 110. In this way, positioning is easier during placement of the sample 140.

In another example, referring to FIG. 7, each support column 110 has a plurality of grooves 120 arranged at intervals. Therefore, a quantity of samples 140 (referring to FIG. 3) carried by the grid structure can be increased. In addition, a distance between adjacent grooves 120 is 5 um to 10 um, for example, 7 um, 8 um, or 9 um. If the distance between the grooves 120 is extremely large, the top surface 130 cannot be fully utilized. If the distance between the grooves 120 is extremely small, it is difficult to place the sample 140. The distance between the grooves 120 in the range of 5 um to 10 um allows full use of the top surface 130 and easy placement of the sample 140.

The top surface 130 of the support column 110 includes a flat surface or a curved surface. In an embodiment of the present disclosure, the top surface of the support column 110 is a flat surface, helping improve stability of placement of the sample 140.

Figure 8:
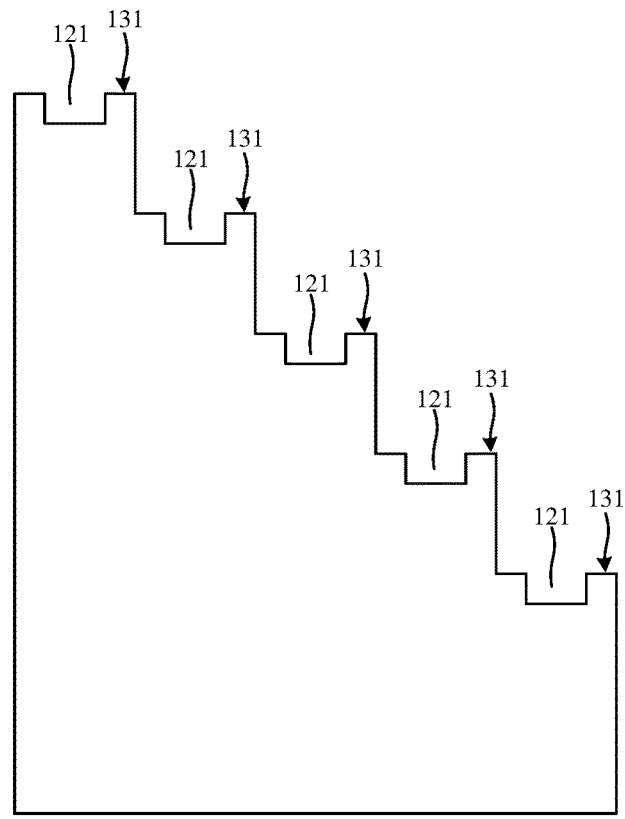
FIG. 8 is a front view of a fourth support column of a grid structure according to an embodiment of the present disclosure.

Referring to FIG. 8, alternatively, the top surface 130 (referring to FIG. 4) of the support column 110 (referring to FIG. 4) may be a stepped surface. The top surface 130 of the support column 110 includes a plurality of first top surfaces 131, and the plurality of first top surfaces 131 form a stepped surface. The groove 120 (referring to FIG. 4) includes a plurality of first grooves 121. Each first groove 121 corresponds to each first top surface 131, and a groove wall of each groove 120 is connected to the corresponding first top surface 131. The formation of the stepped surface allows more samples 140 (referring to FIG. 3) to be accommodated, and positioning is easier during placement of the plurality of samples 140.

Referring to FIG. 3 to FIG. 11, a top opening of the groove 120 is greater than or equal to a bottom opening of the groove 120. In this way, a contact area between the top surface 130 and the sample 140 can be reduced, contamination of the sample 140 by the secondary ions can be reduced, and a subsequent imaging effect of a transmission electron microscope can be improved.

In this embodiment, the top opening of the groove 120 is equal to the bottom opening of the groove 120. Therefore, when top openings of a plurality of grooves 120 are the same, a groove 120 whose top opening and bottom opening are equal to each other has a larger volume, and a diversion effect of the secondary ions is better.

The top opening and the bottom opening of the groove 120 may be in a rectangular shape or a circular shape.

In an extension direction perpendicular to the support column 110, a width b of the top opening of the groove 120 is 1 um to 20 um, for example, 1 um, 5 um, or 10 um. A width design of 1 um is suitable for observation of a fine-sized structure, and a smaller width of the groove 120 ensures stability of the sample 140 and a success rate of the observation. A width design of 5 um is suitable for observation of preparation of a commonly used sample. A width design of 10 um is suitable for observation of a large-sized structure, and a larger width of the groove 120 ensures that the sample 140 has high quality in a range of a large region, and avoids contamination caused by sputtering of the secondary ions.

The width of the sample 140 is 20 um to 40 um. The width of the sample 140 needs to be greater than a width of the top opening of the groove 120, and a width difference is 10 um to 20 um. If the width difference is extremely large, a diversion effect of the groove 120 is small. If the width difference is extremely small, it is difficult to place the sample 140 stably. The width difference in the range of 10 um to 20 um allows the groove to have a favorable diversion effect and facilitates stable placement of the sample 140.

A depth a of the groove 120 is 10 um to 100 um in the direction from the top surface 130 to the carrier 100. If the depth a of the groove 120 is small, the diversion effect of the groove 120 is small. If the depth a of the groove 120 is extremely large, it is more difficult to form the groove 120. The depth a of the groove in the range of 10 um to 100 um allows the groove 120 to have a favorable diversion effect and reduces difficulty of forming the groove 120.

Figure 9:
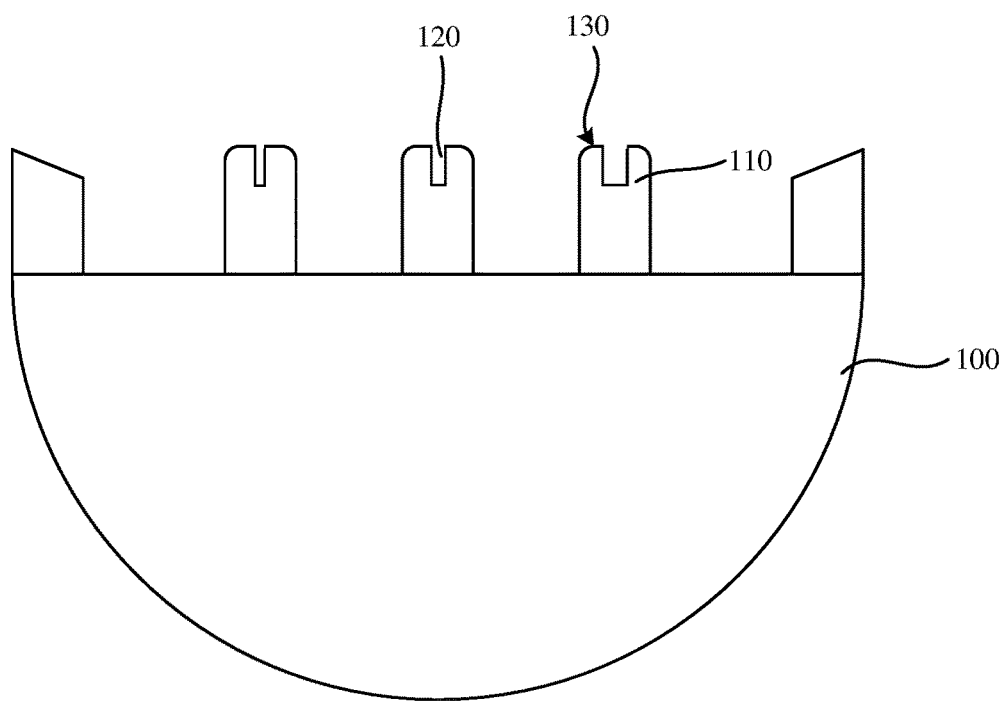
FIG. 9 is a front view of a second grid structure according to an embodiment of the present disclosure.
Figure 10:
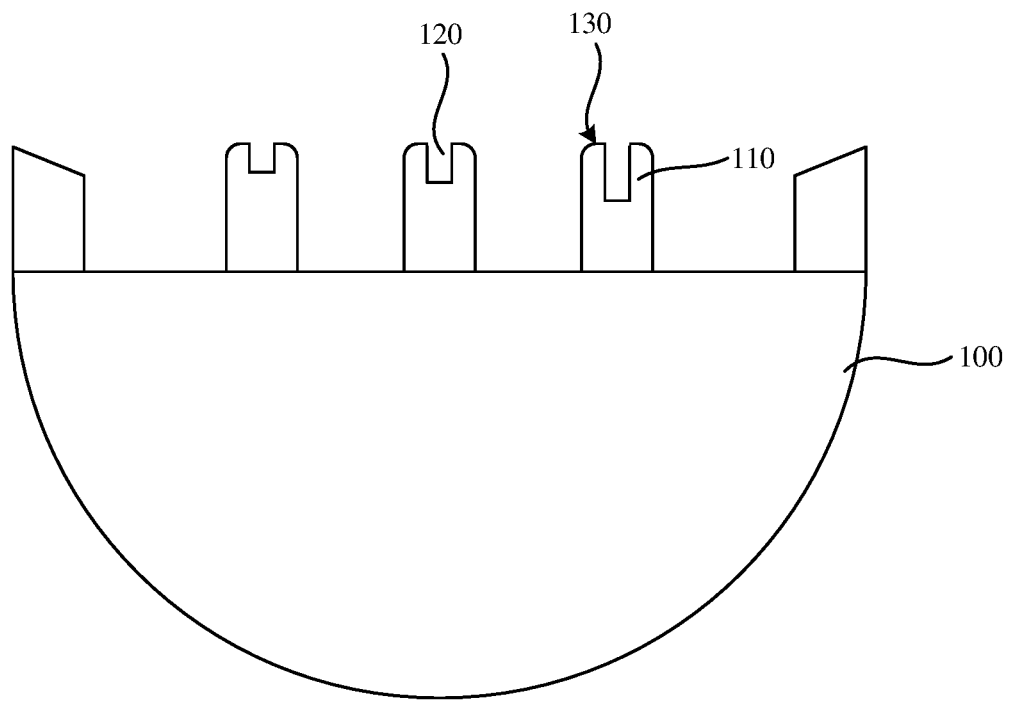
FIG. 10 is a front view of a third grid structure according to an embodiment of the present disclosure.
Figure 11:
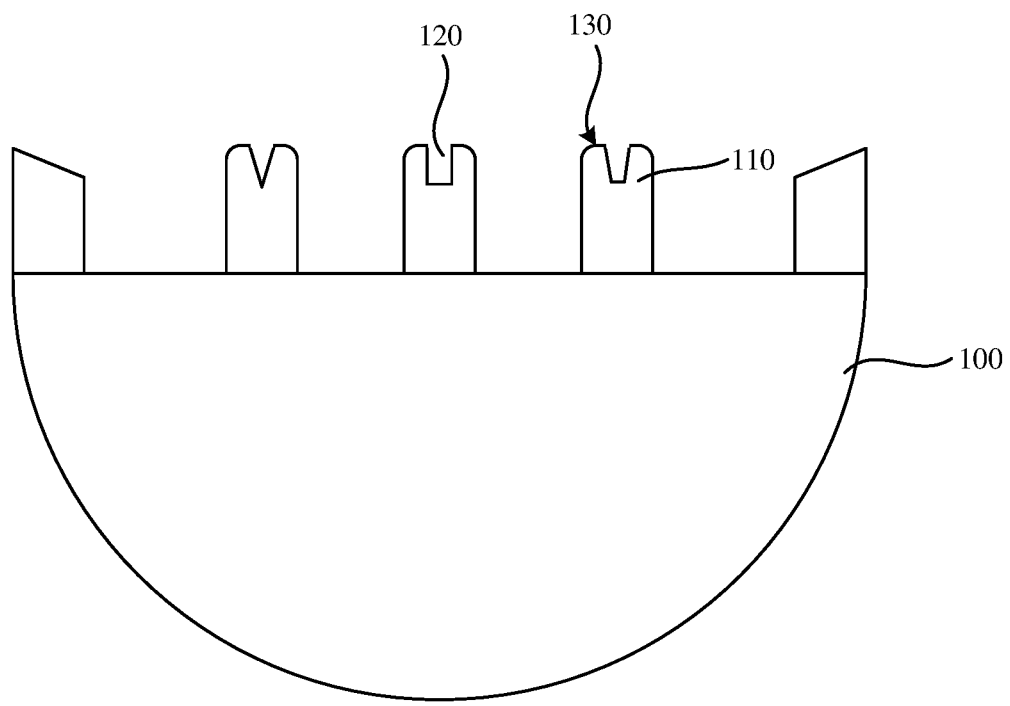
FIG. 11 is a front view of a fourth grid structure according to an embodiment of the present disclosure.

Referring to FIG. 9 to FIG. 11, the grooves 120 located on different support columns 110 have different volumes. Therefore, the plurality of grooves 120 can carry samples 140 of different sizes. Designing grid structures with different combinations of grooves 120 can be applied to different scenarios, and improve grid structure usage efficiency, thereby reducing usage costs.

The technical solutions concerning grooves 120 with different volumes on different support columns 110 include the following several specific examples:

Example 1

Referring to FIG. 9, the grooves 120 located on different support columns 110 have different widths in an extension direction perpendicular to the support column 110. For example, the grid structure is provided with three support columns 110, and the three support columns 110 respectively have grooves 120 with a width of 1 um, 5 um, and 10 um. It may be understood that, when each support column 110 has a plurality of grooves 120, the plurality of grooves 120 located on the same support column 110 may have different widths in the extension direction perpendicular to the support column 110. In this way, observation of a small-sized fine structure and common-sized and large-sized samples can all be met, sample quality can be ensured, and contamination caused by sputtering of the secondary ions can be avoided.

Example 2

Referring to FIG. 10, the grooves 120 located on the different support columns 110 have different depths in the direction from the top surface 130 to the carrier 100. For example, the grid structure is provided with three support columns 110, and the three support columns 110 respectively have grooves 120 with a depth of 20 um, 30 um, and 40 um. It may be understood that, when each support column 110 has a plurality of grooves 120, the plurality of grooves 120 located on the same support column 110 may have different depths in the direction from the top surface 130 to the carrier 100.

Example 3

Referring to FIG. 11, the grooves 120 located on the different support columns 110 are in different shapes. For example, the grid structure is provided with three support columns 110, and the three support columns 110 respectively have an inverted triangular groove 120, an inverted trapezoidal groove 120, and a rectangular groove 120. When each support column 110 has a plurality of grooves 120, the plurality of grooves 120 located on the same support column 110 may be in different shapes. The grooves 120 in different shapes may further be used as identification marks for the support column 110. When the support column 110 carries a plurality of samples 140, the identification marks can be used for quick positioning.

The grid structure provided in the embodiment of the present disclosure has a top surface for supporting a sample and a groove located in a support column. The groove can be used to divert secondary ions and reduce contamination of the sample. In addition, placement of the sample on the top of the support column is more stable than placement of the sample on a side wall of the support column. In this way, a subsequent imaging effect of a transmission electron microscope can be improved. In addition, different types of support columns and grooves can be arranged according to experimental requirements, so that a quantity and types of samples that can be carried are increased, thereby reducing costs.

In the description of this specification, the description with reference to the terms "embodiments", "exemplary embodiments", "some implementations", "exemplary implementations", "examples", and the like means that the specific features, structures, materials, or characteristics described in conjunction with the implementations or examples are included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

In the description of the present disclosure, it should be noted that orientations or position relationships indicated by terms "center", "top", "bottom", "left", "right", "vertical", "horizontal", and the like are orientation or position relationships shown in the accompanying drawings, and these terms are used only to facilitate description of the present disclosure and simplify the description, but not to indicate or imply that the mentioned apparatuses or elements must have a specific orientation or must be constructed and operated in a specific orientation. Therefore, these terms should not be understood as a limitation on the present disclosure.

It can be understood that the terms "first", "second", and the like used in the present disclosure can be used in the present disclosure to describe various structures, but these structures are not limited by these terms. These terms are used only to distinguish a first structure from another structure.

In one or more accompanying drawings, the same elements are represented by similar reference numerals. For clarity, a plurality of parts of the accompanying drawings are not drawn to scale. In addition, some well-known parts may not be shown. For brevity, a structure obtained after several steps can be illustrated in one figure. Many particular details of the present disclosure, such as the structure, material, size, processing process, and technology of the device, are described below for a clearer understanding of the present disclosure. However, as can be understood by persons skilled in the art, the present disclosure may be implemented without following these particular details.

Finally, it should be noted that the foregoing embodiments are used only to explain the technical solutions of the present disclosure, but are not intended to limit the present disclosure. Although the present disclosure has been described in detail with reference to the foregoing embodiments, persons of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

INDUSTRIAL APPLICABILITY

According to the grid structure provided in the embodiments of the present disclosure, a support column has a top surface for supporting a sample, and the support column has a groove. Compared with placement of the sample on the side wall of the support column, placement of the sample on the top surface of the support column provides better sample stability, and the groove can be used for diversion, thereby reducing contamination of the sample by secondary ions, and improving a subsequent imaging effect of a transmission electron microscope.

The invention claimed is:

1. A grid structure, comprising:
a carrier; and
a support column, the support column being located on the carrier, wherein
the support column has a top surface for supporting a sample;
the support column has a groove, the groove extends along a direction from the top surface to the carrier, and a groove wall of the groove is connected to the top surface; and
a depth of the groove is 10 μm to 100 μm in the direction from the top surface to the carrier.

2. The grid structure according to claim 1, wherein the top surface is located at least on two sides of the groove.

3. The grid structure according to claim 2, wherein the top surface surrounds the groove.

4. The grid structure according to claim 1, wherein the top surface surrounds the groove.

5. The grid structure according to claim 1, wherein a top opening of the groove is greater than or equal to a bottom opening of the groove.

6. The grid structure according to claim 1, wherein a width of a top opening of the groove is 1 μm to 20 μm in an extension direction perpendicular to the support column.

7. The grid structure according to claim 1, wherein grooves located on different support columns have different volumes.

8. The grid structure according to claim 7, wherein the grooves located on the different support columns have different widths in an extension direction perpendicular to the support column.

9. The grid structure according to claim 7, wherein the grooves located on the different support columns have different depths in the direction from the top surface to the carrier.

10. The grid structure according to claim 1, wherein each support column has a plurality of grooves arranged at intervals, and a distance between adjacent grooves is 5 μm to 10 μm.

11. The grid structure according to claim 1, wherein each support column has one groove, and a central axis of the groove coincides with a central axis of the support column.

12. The grid structure according to claim 1, wherein the top surface of the support column comprises a flat surface or a curved surface.

13. The grid structure according to claim 1, wherein the top surface of the support column comprises a plurality of first top surfaces, and the plurality of first top surfaces form a stepped surface; the groove comprises a plurality of first grooves, each first groove corresponds to each first top surface, and a groove wall of each groove is connected to the corresponding first top surface.

14. A grid structure, comprising:
a carrier; and
a support column, the support column being located on the carrier, wherein
the support column has a top surface for supporting a sample;
the support column has a groove, the groove extends along a direction from the top surface to the carrier, and a groove wall of the groove is connected to the top surface;
grooves located on different support columns have different volumes; and
the grooves located on the different support columns have different depths in the direction from the top surface to the carrier.

15. A grid structure, comprising:
a carrier; and
a support column, the support column being located on the carrier, wherein
the support column has a top surface for supporting a sample;
the support column has a groove, the groove extends along a direction from the top surface to the carrier, and a groove wall of the groove is connected to the top surface; and
the top surface of the support column comprises a plurality of first top surfaces, and the plurality of first top surfaces form a stepped surface; the groove comprises a plurality of first grooves, each first groove corresponds to each first top surface, and a groove wall of each groove is connected to the corresponding first top surface.

\* \* \* \* \*